United States Patent [19]

Coffey et al.

[11] Patent Number: 5,070,392

[45] Date of Patent: Dec. 3, 1991

[54] INTEGRATED CIRCUIT HAVING LASER-ALTERABLE METALLIZATION LAYER

[75] Inventors: Michael Coffey, Westboro; Richard J. Hollingsworth, Concord, both of Mass.

[73] Assignee: Digital Equipment Corporation, Maynard, Mass.

[21] Appl. No.: 303,562

[22] Filed: Jan. 27, 1989

Related U.S. Application Data

[62] Division of Ser. No. 170,280, Mar. 18, 1988, Pat. No. 4,849,363.

[51] Int. Cl.$^5$ .................. H01L 21/268; H01L 21/82
[52] U.S. Cl. ........................ 357/71; 437/192; 357/73; 357/68; 357/65
[58] Field of Search ............ 357/71, 65, 68, 73; 437/173, 174

[56] References Cited

U.S. PATENT DOCUMENTS

| 4,209,894 | 7/1980 | Keen | 29/577 R |
|---|---|---|---|
| 4,507,851 | 4/1985 | Joyner et al. | 437/192 |
| 4,556,897 | 12/1985 | Yorikane et al. | 357/71 |
| 4,617,193 | 10/1986 | Wu | 357/71 |
| 4,698,125 | 10/1987 | Rhodes | 437/228 |
| 4,740,485 | 4/1988 | Sharpe-Geisler | 437/246 |
| 4,758,533 | 7/1988 | Magee et al. | 437/173 |
| 4,826,785 | 5/1989 | McClure et al. | 437/174 |
| 4,849,363 | 7/1989 | Coffey et al. | 437/19 |
| 4,912,066 | 3/1990 | Wills | 437/173 |
| 4,968,643 | 11/1990 | Mukai | 437/174 |

FOREIGN PATENT DOCUMENTS

| 58-23475 | 12/1983 | Japan . | |
| 61-22652 | 1/1986 | Japan . | |
| 61-51940 | 3/1986 | Japan | 357/71 |
| 62-119938 | 6/1987 | Japan . | |

OTHER PUBLICATIONS

Potts, "Patterned Laser Heating", IBM TDB, vol. 25, No. 9, Feb. 83, pp. 4763-4764.
IBM TDB, "Planarization of Metal Layers for Interconnections on Integrated Circuits", vol. 14, No. 2, May 72, pp. 3837-3838.
IBM TDB, "Tungsten-on-Conducting Nitride Composite Films", vol. 31, No. 3, Aug. 88, pp. 477-478.

*Primary Examiner*—Andrew J. James
*Assistant Examiner*—Viet Q. Nguyen
*Attorney, Agent, or Firm*—Arnold, White & Durkee

[57] ABSTRACT

An integrated circuit and a method of altering such an integrated circuit (e.g., during final testing of the circuit) are such that the method can be used to program a circuit, wire around defective portions of a circuit, or otherwise permanently alter a circuit by employing a directed energy source such as a laser to sever electrical paths in an upper layer of metallization in an integrated circuit. The integrated circuit comprises a laminated upper metallization layer, the upper layer(s) of which laminate are removed from the laser-alterable lower layer at selected locations in the metallization layer to provide laser-alteration sites in the circuit. In a preferred embodiment, the upper metallization layer comprises a two-layer laminate including an upper, relatively thick layer of an aluminum/silicon alloy and a lower, relatively thin layer of titanium nitride.

20 Claims, 3 Drawing Sheets

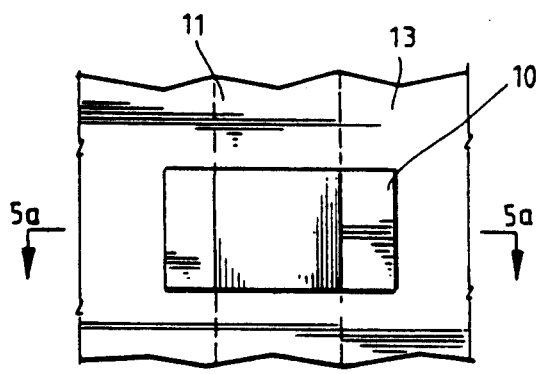
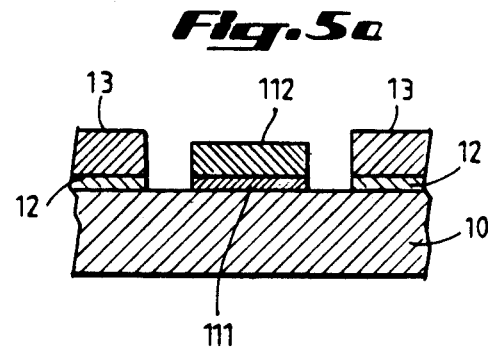
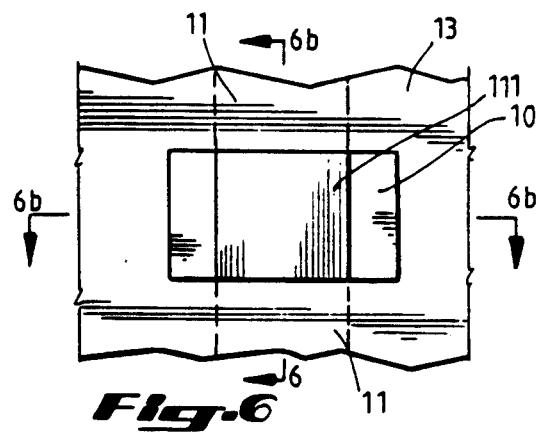
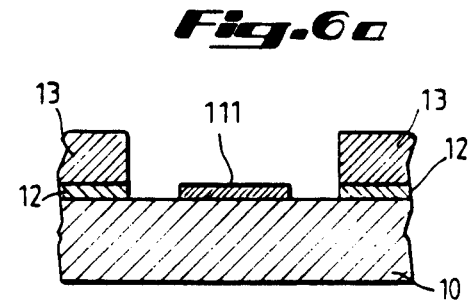
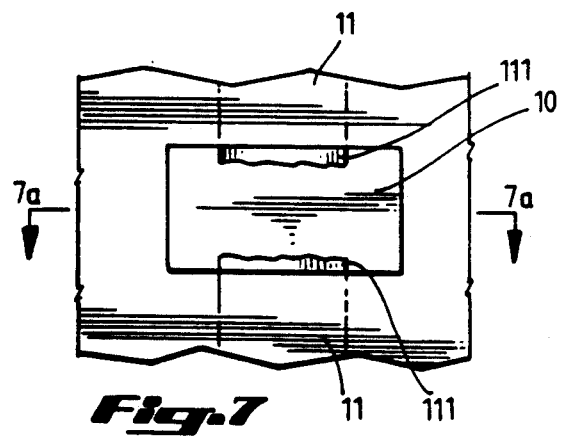
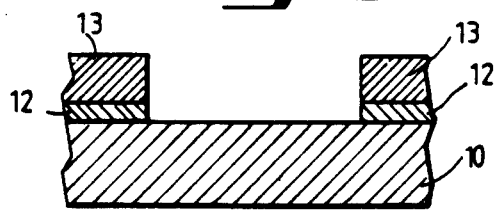

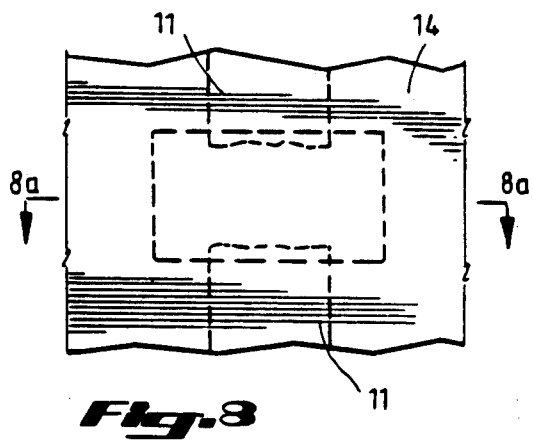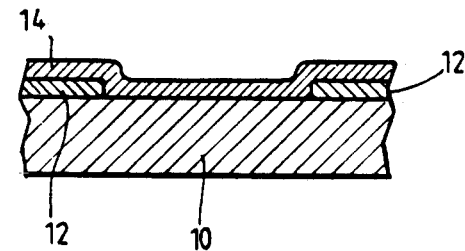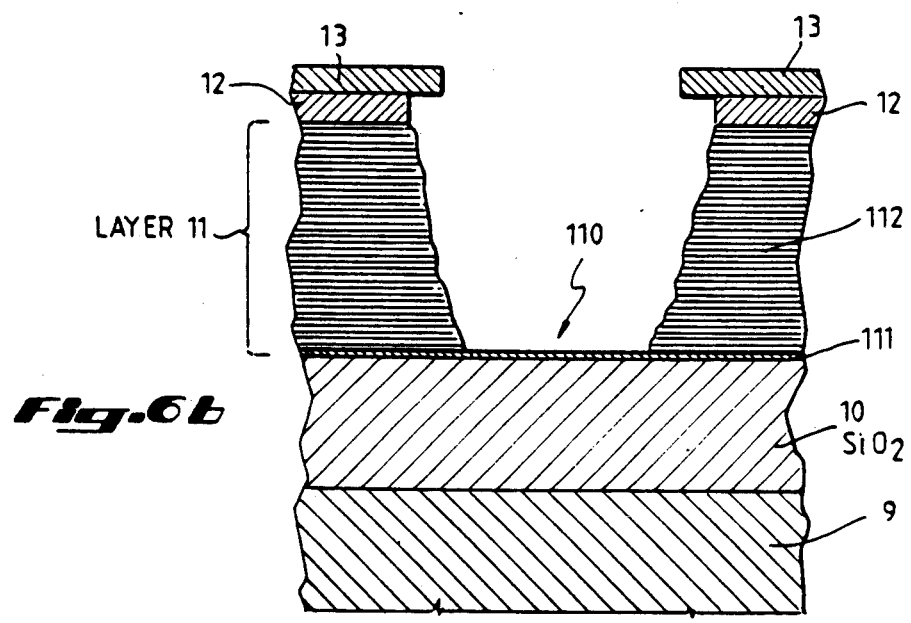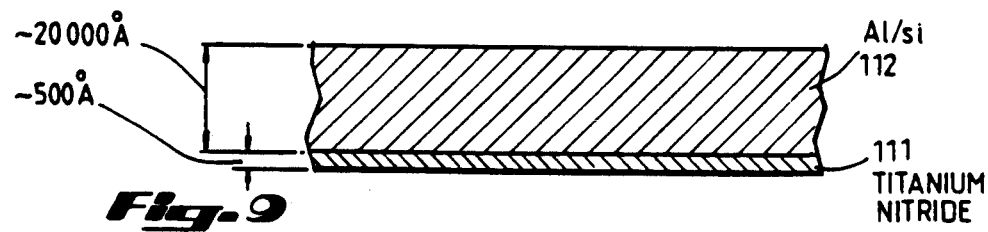

INTEGRATED CIRCUIT HAVING LASER-ALTERABLE METALLIZATION LAYER

This application is a division of copending application Ser. No. 170,280, filed Mar. 18, 1988, now U.S. Pat. No. 4,849,363.

BACKGROUND OF THE INVENTION

1. Field of the Invention

This invention relates to integrated electronic circuits. More particularly, it relates to small-geometry VLSI and ULSI circuits having multiple levels of metallic interconnects. The invention especially relates to a laser-alterable layer of metallization in an integrated circuit having multiple layers or levels of metallization.

2. Description of the Related Art

When fabricating Very Large Scale Integrated circuits and Ultra Large Scale Integrated circuits (VLSI and ULSI circuits) such as Dynamic Random Access Memory (DRAM) chips and Static Random Access Memory (SRAM) chips, it is often desirable to build redundancy into such circuits so as to increase the yield of acceptable chips. For example, a DRAM or SRAM chip might be designed to include one or more redundant rows or columns. During final testing of the chip, if a fault is detected it is desirable to be able to "wire around" the defect and thereby salvage what would otherwise be a defective chip.

As is well-known in the art, it is often possible to design a circuit such that "wiring around" a defect may simply be accomplished by breaking one or more electrical interconnects in the circuit. Using the techniques of the prior art, this has been accomplished in integrated circuits at the polysilicon (p-Si) level (layer 3 in FIGS. 1 and 2) most commonly by vaporizing a selected portion of the polysilicon using a laser. This technique necessitates the removal of the intervening layers of dielectric material (layers 4 and 6 in FIG. 1 and layers 4, 6, 8, 10, and 12 in FIG. 2) prior to the laser vaporization step. Masking, followed by wet chemical or plasma etching, is commonly used to remove the superimposed dielectric layers of silicon dioxide (layers 4 and 6 in FIG. 1 and layers 4, 6, 8, 10 and 12 in FIG. 2).

However, using the methods of the prior art, it is not possible to reliably etch down to the polysilicon layer and stop the etching exactly at the polysilicon/silicon dioxide interface. It is common practice to over-etch by approximately 10-20% so as to ensure substantially complete removal of the overlaying dielectric layers.

For integrated circuits having multiple metallization interconnect layers (as illustrated in FIG. 2) the etching techniques of the prior art jeopardize the integrity of the silicon substrate. This situation arises because, as the number of layers of metallization increases, the ratio of dielectric material above the polysilicon layer to dielectric material below that layer increases. Thus, for a given over-etch percentage, the absolute depth of the over-etch increases. This means that when an integrated circuit comprises multiple metallization layers it becomes increasingly likely that the oxide layer (layer 2 in FIGS. 1 and 2) which overlies the silicon substrate will be etched through, and thus at that locus, one no longer has single crystal silicon (c-Si) protected by an oxide layer. Moreover, since wet chemical etching is typically isotropic, the greater the number of layers which must be etched through to reach the polysilicon layer, the larger the cross-sectional area of the "window" or "hole" produced by the etching. As circuit density increases, this becomes more and more of a problem.

For the above reasons and for the sake of general convenience, it would be desirable to be able to laser-alter integrated circuits at the upper level of metallization inasmuch as this would greatly reduce the amount of etching required, especially for circuits having multiple metallization layers Moreover, the uppermost layer of metallization is the most accessible interconnect layer. There are a number of reasons why laser-alteration of integrated circuits in their upper metallization layer has not been feasible in the past.

Metallization layers most commonly comprise aluminum which presents a number of difficulties for processes employing laser vaporization In this regard it is interesting to compare the physical properties of polycrystalline silicon and aluminum, the materials which most often comprise the layers of an integrated circuit wherein the opportunity exists for laser alteration of the circuit. Whereas polycrystalline silicon melts at a relatively high temperature (melting point of Si = 1410° C.), aluminum melts at about 660° C., a significantly lower temperature. In contrast, the boiling points of these two elements are virtually the same (2327° C. versus 2355° C). Moreover, aluminum does not vaporize, even at high temperatures. Although judging from its relatively low melting point it might seem that aluminum would require less power to vaporize than polycrystalline silicon, aluminum's high boiling point and resistance to vaporization coupled with the reflective nature of aluminum in the portion of the spectrum where appropriate lasers emit necessitates the use of higher powers. It is contemplated that the need for high power levels, in conjunction with the relatively low melting point of aluminum, causes the metal to tend to splatter upon laser vaporization, potentially contaminating surrounding portions of the integrated circuit and possibly shorting other metallization lines in the vicinity of the laser-alteration site. Moreover, the aluminum interconnect lines in the metallization layer(s) are relatively wide and thick compared to the polycrystalline silicon interconnects. Thus, comparatively more material must be removed in the vaporization step of the process if alteration is to be performed in a metallization layer.

The present invention addresses this problem by providing a laminated metallization layer which comprises a refractory, conductive material which is less prone to splatter when an interconnect line of the material in the metallization layer is severed by laser vaporization. Using the process of the present invention allows one to design and build an integrated circuit which may be laser-altered in an upper layer of metallization, preferably the uppermost layer. This greatly reduces the extent of etching which is required in the methods of the prior art, thereby eliminating or greatly reducing the abovedescribed problems associated with etching down to the polycrystalline silicon layer of an integrated circuit. Additionally, the present invention allows the laser-alteration of an integrated circuit by the removal of a relatively small volume of material. This reduces the chances of contaminating portions of the circuit in the vicinity of the laser-alteration site.

SUMMARY OF THE INVENTION

This invention enables the design of integrated circuits which can be permanently altered during final testing. The method disclosed herein can be used to program a circuit, wire around defective portions of a circuit, or otherwise permanently alter the circuit by severing electrical paths in an upper layer of metallization in the integrated circuit.

In general, an upper metallization layer of the invention comprises a laminate, the upper layer(s) of which can be selectively removed from the laser-alterable lower layer(s). In a preferred embodiment, the metallization layer of the invention comprises a two-layer laminate including an upper, relatively thick layer of an aluminum/silicon alloy and a lower, relatively thin layer of titanium nitride. The lower layer is considerably more refractory than the upper layer, and hence it can be severed by a directed energy source such as a laser with minimal splattering and little or no contamination of surrounding circuitry. A typical thickness of the upper layer of the laminate is approximately 20,000 angstroms while that of the lower layer is approximately 500 angstroms.

BRIEF DESCRIPTION OF THE DRAWINGS

FIG. 5 is a top plan view of the circuit location shown in FIG. 3 after the removal of the dielectric insulating (or passivating) layer.

FIG. 5A is a cross sectional view of the upper layers of the circuit in the plane indicated by the dashed line in FIG. 5.

FIG. 6 is a top plan view of the circuit location shown in FIG. 3 after removal of the upper layer of the laminated metallization layer.

FIGS. 6A and 6B are cross sectional views of the upper layers of the circuit in the orthogonal planes indicated by the dashed lines in FIG. 6.

FIG. 7 is a top plan view of the circuit location shown in FIG. 3 after laser-alteration of the circuit at that site.

FIG. 7A is a cross sectional view of the upper layers of the circuit in the plane indicated by the dashed line in FIG. 7.

FIG. 8 is a top plan view of the circuit location shown in FIG. 3 following the removal of photoresist and application of a passivating layer.

FIG. 8A is a cross sectional view of the upper layers of the circuit in the plane indicated by the dashed line in FIG. 8.

FIG. 9 is a cross sectional view of one preferred embodiment of the laminated metallization layer of the present invention prior to selective removal of portions of the upper layer of the laminate.

DETAILED DESCRIPTION

Figure 1:
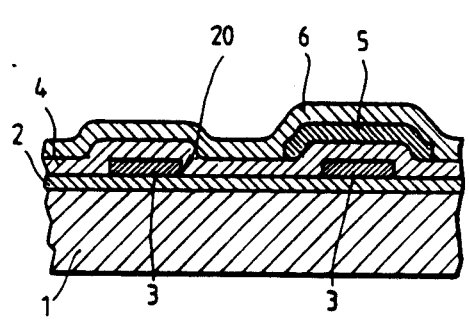
FIG. 1 is a cross sectional view of a typical integrated circuit having a single metallization layer.

The present invention comprises a laminated upper level of metallization for integrated circuits. At least one layer of the laminate is formed of a refractory electrical conductor such as titanium nitride. Generally, materials which are suitable for use in this layer of the laminate comprise refractory conductors which do not readily alloy or form intermetallic compounds with the other layer(s) of the laminate. Examples of such materials include tungsten, titanium, cobalt, tantalum, zirconium, titanium/tungsten alloys, and nitrides of tantalum, tungsten, titanium, and zirconium.

In a preferred embodiment, the laminate is composed of two layers. The upper layer is formed of a good electrical conductor such as aluminum, copper, silver, gold, or alloys comprising such metals. Particularly preferred is an aluminum-silicon alloy containing about 1% silicon by weight. Good electrical conductors such as the metals mentioned above typically have relatively low melting points as compared to more refractory materials such as tungsten, tantalum, and titanium nitride. The upper layer is thick relative to the lower layer and typically carries the bulk of the electrical current at unaltered locations in the metallization layer. As illustrated in FIG. 9, upper layer 112 might have a thickness of approximately 20,000 angstroms while lower layer 111 has a thickness of approximately 500 angstroms.

The lower layer is formed of an electrical conductor having a relatively high melting point. Examples of such material are the refractory metals such as titanium, tungsten, zirconium, and tantalum and compounds and alloys comprising those elements such as titanium nitride and zirconium nitride.

To laser-alter a circuit comprising such a laminated interconnect, the upper layer is selectively removed at the desired circuit alteration site as by masking and etching with an etchant which will attack the material of the upper layer of the laminate but which does not appreciably etch the lower layer. If the upper layer comprises an aluminum/silicon alloy and the lower layer comprises titanium nitride, a particularly preferred etchant comprises a mixture of acetic, nitric, and phosphoric acids wherein the ratios of the various acids are as follows: 10-20% by volume glacial acetic acid; 2-6% by volume concentrated nitric acid (70%, d=1.4134); and, 70-95% by volume phosphoric acid (85%, d=1.6850). Especially preferred is an etchant comprising 20% acetic acid, 3% nitric acid, and 77% phosphoric acid. This acid mixture does not appreciably etch either titanium nitride or silicon dioxide. Thus, at the circuit alteration locations the bulk of the laminate can be removed by etching, and the etching can be accomplished with virtually no risk of over-etching inasmuch as the lower layer of the laminate and the surrounding dielectric are resistant to the action of the etchant. This makes it possible to reliably etch down to the interface of the two layers of the laminate. In contrast, the methods of the prior art use hydrofluoric acid as an etchant or plasma chemistries such as $CHF_3/O_2$, $C_2F_6/O_2$, or $CF_4/H_2$ since silicon dioxide must be removed in the etching process. This etching is significantly more difficult to control than that used in the present invention.

In practice, areas of the integrated circuit designated to be the laser removable links are patterned, for example by using a photolithographic technique, while the circuits are being processed in a clean-room environment. The top layer of the laminate is then chemically removed, using either plasma chemistry or the wet chemical method described above, leaving the bottom layer of the laminate exposed. The circuit can now be sent for electrical testing and the process of altering the circuit with a laser or other directed energy source can proceed.

The same lasers used in the methods of the prior art can be employed in the practice of the instant invention. Particularly preferred is the use of a pulsed yttrium-aluminum-garnet (YAG) laser emitting at a wavelength of 530 nanometers and having a power output adjustable between about 5 and 200 micro-Joules per pulse, a pulse repetition rate of 3 pulses/second and a 10-nanosecond pulse width.

As in the techniques of the prior art, following laser alteration of the circuit, a passivating layer such as $SiO_2$ or plasma-enhanced, chemically vapor deposited (PECVD) silicon nitride is applied over the upper metallization layer.

Although refractory metals and metal alloys as a general rule have greater resistivity than less refractory metals such as aluminum, they are nonetheless sufficiently good conductors of electricity to permit their use as interconnects in integrated circuits. In the illustrated embodiment of the present invention, the bulk of the current is carried by the relatively thick upper layer of the laminated metallization layer which predominately comprises aluminum, an excellent conductor. Only at the sites of the fusible links is the upper layer removed and the lower refractory layer relied on to carry the electrical current. Inasmuch as these fusible links are typically small and relatively few in number, the overall resistance of the interconnect is not appreciably increased by the localized removal of the upper layer at the location of the fusible links.

Because the bottom layer of the laminate is much thinner and can be made from a material such as a refractory metal, it can be more easily and cleanly removed using laser heating. Materials such as refractory metals also possess electrical conductivity characteristics suitable for application to on-chip wiring. With the laser alterable link removed, the device can be retested to ensure that the circuit is functional or has the desired altered characteristics.

An integrated circuit which embodies the present invention can be fabricated using conventional techniques well-known in the art, FIG. 1 depicts in cross section a portion of an integrated circuit having a single metallization layer (layer 5). A typical integrated circuit having multiple layers of metallization is shown in FIG. 2.

In the figures, layer 1 is the substrate, typically monocrystalline silicon (c-Si). Layer 2 is a dielectric layer comprising silicon dioxide ($SiO_2$). Layer 3 is a polycrystalline silicon (p-Si or "poly"). Layers 4, 6, 8 and 10 are dielectric material, most commonly silicon dioxide. Layers 5, 7, 9 and 11 are metallization layers. These layers typically comprise aluminum and/or an aluminum alloy.

Figure 2:
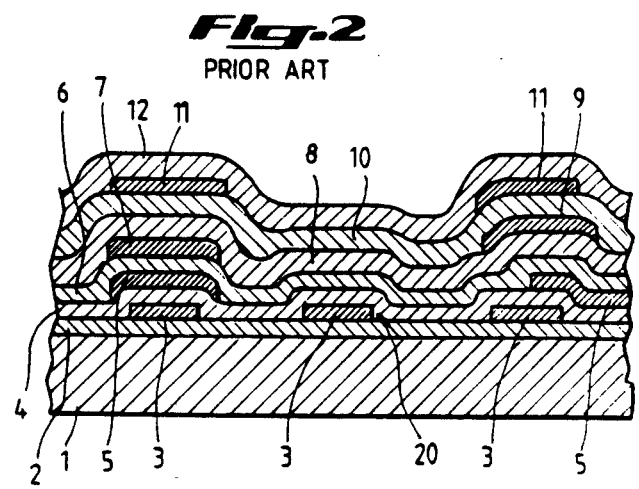
FIG. 2 is a cross sectional view of a typical integrated circuit having multiple metallization layers.

Note that in FIGS. 1 and 2, a portion of polycrystalline silicon 20 is potentially accessible for laser alteration. That is, the circuits are configured such that there is only dielectric material in that part of the integrated circuit which extends from the upper surface of portion 20 to the upper external surface of the chip. Thus, only dielectric material need be removed by chemical etching in order to expose portion 20 for possible removal by laser vaporization. In this way, the electrical interconnects provided in metallization layers 5, 7, 9 and 11 are not disturbed. However, it can readily be appreciated that particularly in the case of circuits having multiple levels of metallic interconnects, providing a straight path for etching down to the polycrystalline silicon layer at each potential laser-alteration site imposes significant constraints on circuit designers.

FIG. 6B is a representation of the cross section of an integrated circuit which embodies the present invention in its uppermost layer of metallization. Like the circuit illustrated in FIG. 2, this circuit has multiple levels of metallization. The laser-alteration site or "fusible link" is indicated as 110 in FIG. 6B.

The uppermost metallization layer 11 can be fabricated using the techniques of the prior art. For example, first a layer approximately 500 angstroms thick of titanium nitride (layer 111 in FIG. 6B) is deposited by sputtering or vapor deposition. Next a layer of Al/Si alloy (layer 112 in FIG. 6B) is deposited on top of the titanium nitride layer to a thickness of approximately 20,000 angstroms also by sputtering or vapor deposition. Selected portions of the laminate are then removed by conventional photolithographic techniques to produce the desired pattern of electrical interconnection. Optionally, a passivating layer (layer 12 in FIG. 6B) such as $SiO_2$ or Si or a mixture thereof is then applied over the upper layer of metallization. This passivating layer (if applied at this point in the process) may be deposited to its full ultimate thickness or to a lesser thickness (such as one-half the ultimate thickness) and the balance deposited after the laser alteration step.

If the passivating layer 12 has been applied, it is removed at selected locations by conventional techniques such as masking with photoresist followed by plasma etching to provide access to the fusible link alteration sites. This portion of the process is illustrated in FIGS. 3-5.

Figure 3:
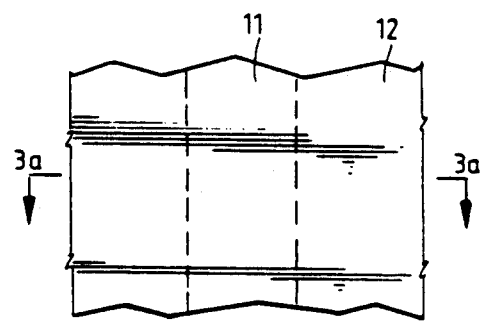
FIG. 3 is a top plan view of a portion of an integrated circuit in the vicinity of a metallic interconnect line. The metallic interconnect line underlying dielectric layer 12 is shown as a dashed line.
Figure 3A:
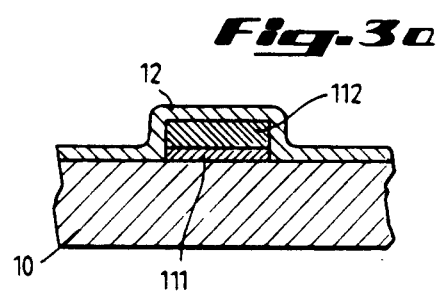
FIG. 3A is a cross sectional view of the upper layers of the circuit in the plane indicated by the dashed line in FIG. 3.
Figure 4:
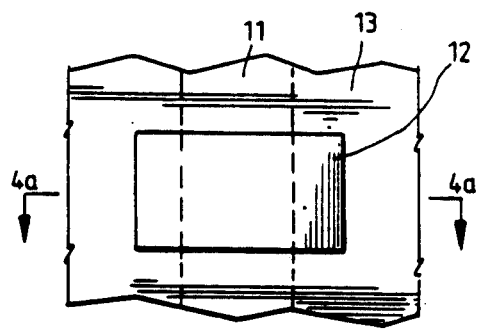
FIG. 4 is a top plan view of the circuit location shown in FIG. 3 after the application of photoresist.
Figure 4A:
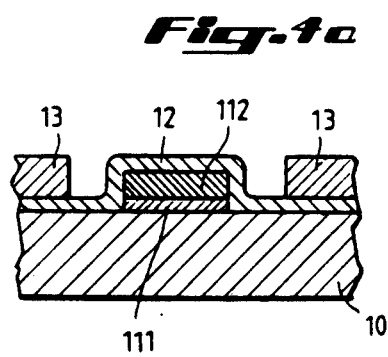
FIG. 4A is a cross sectional view of the upper layers of the circuit in the plane indicated by the dashed line in FIG. 4.

FIG. 3 shows a laser-alteration site in the integrated circuit protected by a dielectric layer 12 which might typically be $SiO_2$, $Si_3N_4$, or a mixture thereof. FIG. 4 shows this same site following application of photoresist 13 to mask the portions where removal of dielectric 12 is not desired.

The upper layer(s) of the laminate comprising the laser-alterable metallization layer 11 is then removed at the fusible link alteration sites (e.g., site 110). This is accomplished by etching with an appropriate etchant such as the acid mixture described above. The integrated circuit at this stage of the process is illustrated in FIG. 6. FIGS. 6A and 6B are cross sectional views through orthogonal planes. As indicated in FIG. 6, the integrated circuit now comprises a laminated metallization layer which comprises a discontinuous, relatively thick, relatively less refractory electrical conductor 112 and a continuous, relatively thin, relatively more refractory electrical conductor 111.

The circuit is electrically tested to determine if and where the circuit requires alteration. Should alteration be indicated, a selected fusible link(s) is vaporized (i.e., removed) by applying a directed energy source such as a laser to open the circuit at that point. The circuit at this stage of the process is illustrated in FIG. 7.

Following laser alteration, a passivating layer (or the balance of the passivating layer) may be applied to hermetically seal the integrated circuit and protect the remaining intact fusible links. The laser-altered site following application of a passivating layer 14 is shown in FIG. 8.

The foregoing description has been directed to particular embodiments of the invention in accordance with the requirements of the United States patent statutes for the purposes of illustration and explanation. It will be apparent to those skilled in this art, however, that many modifications and changes in the compositions and methods set forth will be possible without departing from the scope and spirit of the invention. It is intended that the following claims be interpreted to embrace all such modifications and changes.

What is claimed is:

1. A laser-alterable integrated circuit device having a conductor strip extending along a face of semiconductor body, said conductor strip comprising a layered construction including a first area having a less refractory conductor material superimposed upon a more refractory conductor material and including a second area of said conductor strip having the less refractory conductor material removed from the more refractory conductor material, said second area being open for impingement of a laser beam.

2. An integrated circuit as recited in claim 1 wherein said less refractory conductor material is selected from the group consisting of aluminum, copper, gold, silver, and alloys comprising those metals.

3. An integrated circuit as recited in claim 1 wherein said more refractory conductor material is selected from the group consisting of tungsten, titanium, cobalt, zirconium, and alloys and compounds comprising those metals.

4. An integrated circuit as recited in claim 1 wherein said more refractory conductor material is selected from the group consisting of tantalum nitride, tungsten nitride, titanium nitride, and zirconium nitride.

5. A laser-alterable integrated circuit device having a conductor strip extending along a face thereof, said conductor strip comprising a metallization layer which includes in a first area a laminate having a relatively thick, relatively less refractory electrical conductor material overlying a relatively thin, relatively more refractory conductor material, and said conductor strip includes in a second area a continuation of said more refractory conductor material without said overlying less refractory conductor material, and wherein said second area has first and second parts, said first part including said more refractory conductor material, and said second part being uncovered whereby said more refractory conductor material may be selectively removed by impingement of a laser beam in said second part of said second area.

6. An integrated circuit as recited in claim 5 wherein said less refractory electrical conductor material is acid-soluble.

7. An integrated circuit as recited in claim 5 wherein said relatively more refractory electrical conductor material is acid-resistant.

8. An integrated circuit as recited in claim 5 wherein said relatively less refractory electrical conductor material comprises aluminum.

9. An integrated circuit as recited in claim 5 wherein said relatively more refractory electrical conductor material comprises titanium nitride.

10. An integrated circuit as recited in claim 5 wherein said relatively less refractory electrical conductor material comprises aluminum and silicon.

11. A laser-alterable semiconductor device having at least one multiple-layer conductor extending along a face thereof, a first part of said at least one conductor having a lower level of a refractory material and an upper level of a material less refractory than said lower level, a second part of said at least one conductor having said upper level selectively removed to leave only said lower level, and at least part of said second part of said at least one conductor being laser-altered by impingement of a laser beam to remove said lower level.

12. A device according to claim 11 wherein said refractory material comprises a nitride of a refractory metal.

13. A device according to claim 12 wherein said refractory material comprises titanium nitride, and said material less refractory comprises aluminum.

14. A device according to claim 11 wherein said upper level is much thicker than said lower level.

15. A device according to claim 11 wherein said upper level has a lower melting point than said lower level.

16. A device according to claim 11 wherein said lower layer is a refractory metal nitride and said upper layer has a melting point much lower than that of said lower layer.

17. An integrated circuit device comprising:
a) a conductor path extending along a face of a semiconductor body, said conductor path having first and second areas;
b) said first area of said conductor path including a lower layer of a refractory material and an upper layer of a non-refractory material;
c) said second area of said conductor path including only said lower layer of said refractory material.

18. An integrated circuit according to claim 17 including a third area of said conductor path, said third area of said conductor path being previously a part of said second area but having said lower layer of refractory material selectively removed.

19. An integrated circuit according to claim 17 wherein said refractory material comprises titanium nitride.

20. An integrated circuit according to claim 17 wherein said non-refractory material comprises aluminum.

* * * * *

UNITED STATES PATENT AND TRADEMARK OFFICE
CERTIFICATE OF CORRECTION

PATENT NO. : 5,070,392
DATED : December 3, 1991
INVENTOR(S) : Coffey, et al

It is certified that error appears in the above-indentified patent and that said Letters Patent is hereby corrected as shown below:

Column 6, line 23, change "Si" to --$Si_3N_4$--.
Column 7, line 26, after "cobalt," insert --tantalum,--.
Column 7, line 51, after "said" insert --relatively--.

Signed and Sealed this

Eighth Day of June, 1993

Attest:

MICHAEL K. KIRK

*Attesting Officer*   Acting Commissioner of Patents and Trademarks